(12) United States Patent
Sutono et al.

(10) Patent No.: US 7,378,832 B2
(45) Date of Patent: May 27, 2008

(54) PROBING HIGH-FREQUENCY SIGNALS

(75) Inventors: Albert Sutono, San Jose, CA (US); Julie Campbell, Beaverton, OR (US); Lawrence Jacobs, Beaverton, OR (US); Yigal Shaul, Cupertino, CA (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 11/508,583

(22) Filed: Aug. 22, 2006

(65) Prior Publication Data

US 2008/0048639 A1   Feb. 28, 2008

(51) Int. Cl.
*G01R 23/00* (2006.01)
*G01R 31/02* (2006.01)
*H04B 15/00* (2006.01)

(52) U.S. Cl. .................. 324/76.19; 324/754; 702/191
(58) Field of Classification Search ............ 324/76.19, 324/76.12, 76.11, 72.5, 754, 757; 439/169, 439/482, 912
See application file for complete search history.

(56) References Cited

U.S. PATENT DOCUMENTS

| | | | |
|---|---|---|---|
| 3,569,869 A * | 3/1971 | Sutton et al. ................. | 333/16 |
| 4,484,792 A | 11/1984 | Tengler et al. | |
| 4,494,082 A * | 1/1985 | Bennett ..................... | 333/28 R |
| 4,586,769 A | 5/1986 | Tengler et al. | |
| 5,274,336 A * | 12/1993 | Crook et al. ................ | 324/690 |
| 5,493,259 A | 2/1996 | Blalock et al. | |
| 5,770,974 A * | 6/1998 | Vogt et al. ................... | 330/272 |
| 6,566,854 B1 * | 5/2003 | Hagmann et al. ........ | 324/117 R |
| 6,606,583 B1 * | 8/2003 | Sternberg et al. ........... | 702/191 |
| 6,650,131 B2 | 11/2003 | Campbell et al. | |
| 6,686,754 B2 * | 2/2004 | Miller ........................ | 324/754 |
| 6,778,602 B2 | 8/2004 | Agazzi et al. | |
| 6,809,539 B2 * | 10/2004 | Wada et al. ................. | 324/762 |
| 6,836,159 B2 * | 12/2004 | Wodnicki .................... | 327/100 |
| 6,863,576 B2 | 3/2005 | Campbell et al. | |
| 6,952,053 B2 | 10/2005 | Huang et al. | |
| 7,030,657 B2 * | 4/2006 | Stojanovic et al. ........... | 326/87 |
| 7,050,388 B2 | 5/2006 | Kim et al. | |

(Continued)

OTHER PUBLICATIONS

PETracer ML Mid-Bus Probe Installation Guide, Manual Version 1.30, Feb. 2005.

(Continued)

*Primary Examiner*—Andrew H. Hirshfeld
*Assistant Examiner*—Hoai-An D Nguyen
(74) *Attorney, Agent, or Firm*—Fish & Richardson P.C.

(57) ABSTRACT

Apparatus and associated systems and methods may relate to a wide bandwidth cable assembly that may include an active amplification stage to receive high frequency signals (e.g., 1 GHz or above) through a transmission line extending distally to a passive, high density signal probe stage. In an illustrative example, the probe stage may receive multiple analog or digital signals from a device under test (DUT). In some embodiments, the probe stage may include probe pins with integrated series resistance to control signal loading, and an equalizer to shape the signal path's frequency response. The amplification stage may provide a virtual ground reference for a termination impedance that may match the transmission line's impedance and may connect in series with a feedback impedance. In one example, a minimally invasive probe head may facilitate measurement of multiple channels of a high speed data bus with minimal signal distortion and/or attenuation.

24 Claims, 10 Drawing Sheets

U.S. PATENT DOCUMENTS

| | | | | |
|---|---|---|---|---|
| 7,292,044 B2* | 11/2007 | Frame | ............... | 324/532 |
| 2004/0183211 A1* | 9/2004 | Alcoe et al. | ............... | 257/786 |
| 2007/0268012 A1* | 11/2007 | Kawabata | ............... | 324/120 |

OTHER PUBLICATIONS http://www.rogerscorporation.com/acm/about_our_products.htm#5870, Aug. 14, 2004.

http://www.rogerscorporation.com/acm/about_our_products.htm#RO4000, Aug. 14, 2004.

http://www.taconic-add.com/pdf/taconic-laminate_material_guide.pdf, Apr. 2006.

http://www.analog.com/en/prod/0,,759_786_AD8000%2C00.html, Feb. 2005.

http://www.analog.com/en/prod/0,,759_842_AD8352%2C00.html, Feb. 2006.

http://www.national.com/pf/LM/LMH6624.html, information as of Aug. 22, 2006.

PCI Express PETracer GEN2 Summit—LeCroy, Jul. 25, 2006.

Overcoming signal integrity issues with wideband crosstalk cancellation technology (M. Vrazel, A. Kim), Design Con 2006, Santa Clara, CA, Feb. 2006.

H. Johnson et al., "High-speed signal propagation: advanced black magic," Textbook, Chapters 8,9, and 11, pp. 277-331, 333-400 and 471-549, published 2003.

Eric Bogatin, Signal Integrity—Simplified, Textbook, Chapter 6, pp. 363-438, published 2003.

* cited by examiner

Differential traces

PROBING HIGH-FREQUENCY SIGNALS

TECHNICAL FIELD

Various embodiments relate to detecting signals over a wide frequency range.

BACKGROUND

Data rates continue to increase in digital systems, communication systems, computer systems, and in other applications. In such applications, various devices communicate data using signals that may be encoded with information in the form of signal levels (e.g., amplitude) in certain intervals of time. Proper decoding of signals, for example, may involve measuring small signal levels in the correct time intervals. As data rates increase, margins of error for the signal level timing tend to decrease.

Likewise, operating frequencies for some analog signal processing systems continue to increase along with advances in telecommunication technologies, for example.

Various test and measurement equipment may be used to verify signal integrity in analog and digital systems. For example, oscilloscopes may be used to measure analog waveforms, and protocol analyzers may be used to monitor data in digitally formatted signals.

In a typical measurement set-up example, a measurement cable assembly may connect a protocol analyzer to one or more digital data lines on a device under test (DUT). The cable assembly may have multiple parallel conductive paths that serve as transmission lines for the signals to be monitored. In some cases, each conductive path may include a combination of different transmission line sections, which may include any or all of, for example, an interface to the DUT, traces on a printed circuit board (PCB), and a flexible cable.

SUMMARY

Apparatus and associated systems and methods may relate to a wide bandwidth cable assembly that may include an active amplification stage to receive high frequency signals (e.g., 5 GHz or above) through a transmission line extending distally to a passive, high density signal probe stage. In an illustrative example, the probe stage may receive multiple analog or digital signals from a device under test (DUT). In some embodiments, the probe stage may include probe pins with integrated series resistance to control signal loading, and an equalizer to shape the signal path's frequency response. The amplification stage may provide a virtual ground reference for a termination impedance that may match the transmission line's impedance and may connect in series with a feedback impedance. In one example, a minimally invasive probe head may facilitate measurement of multiple channels of a high speed data bus with minimal signal distortion and/or attenuation.

In some embodiments, an amplitude gain of the amplification stage may be greater than one within a frequency range of interest. Frequencies of interest may include, for example, DC to at least about 200 GHz, such as between about 1 GHz and 200 GHz, 4 GHz and 100 GHz, or 10 GHz and 50 GHz, and may involve, for example, data rates above about 5 Gbits/sec for each of one or more channels.

Certain embodiments may provide one or more of the following advantages. For example, physically separating an amplifier from a probe may facilitate interface of high density probes with multiple channels on DUT. Such a high density probe may feature a reduced footprint and/or keep-out zone requirement to accommodate, for example, a multi-channel probe. Some embodiments may control signal loading at the probe tip without increasing component count by providing probe pins with resistive coatings. Embodiments with a series termination impedance to a virtual ground reference may substantially avoid pre-amplifier signal attenuation, for example.

The details of one or more embodiments are set forth in the accompanying drawings and the description below. Other features, objects, and advantages will be apparent from the description and drawings, and from the claims.

DESCRIPTION OF DRAWINGS

FIGS. 7A-7E show example equalizer implementations.

Like reference symbols in the various drawings indicate like elements.

DETAILED DESCRIPTION OF ILLUSTRATIVE EXAMPLES

Figure 1:
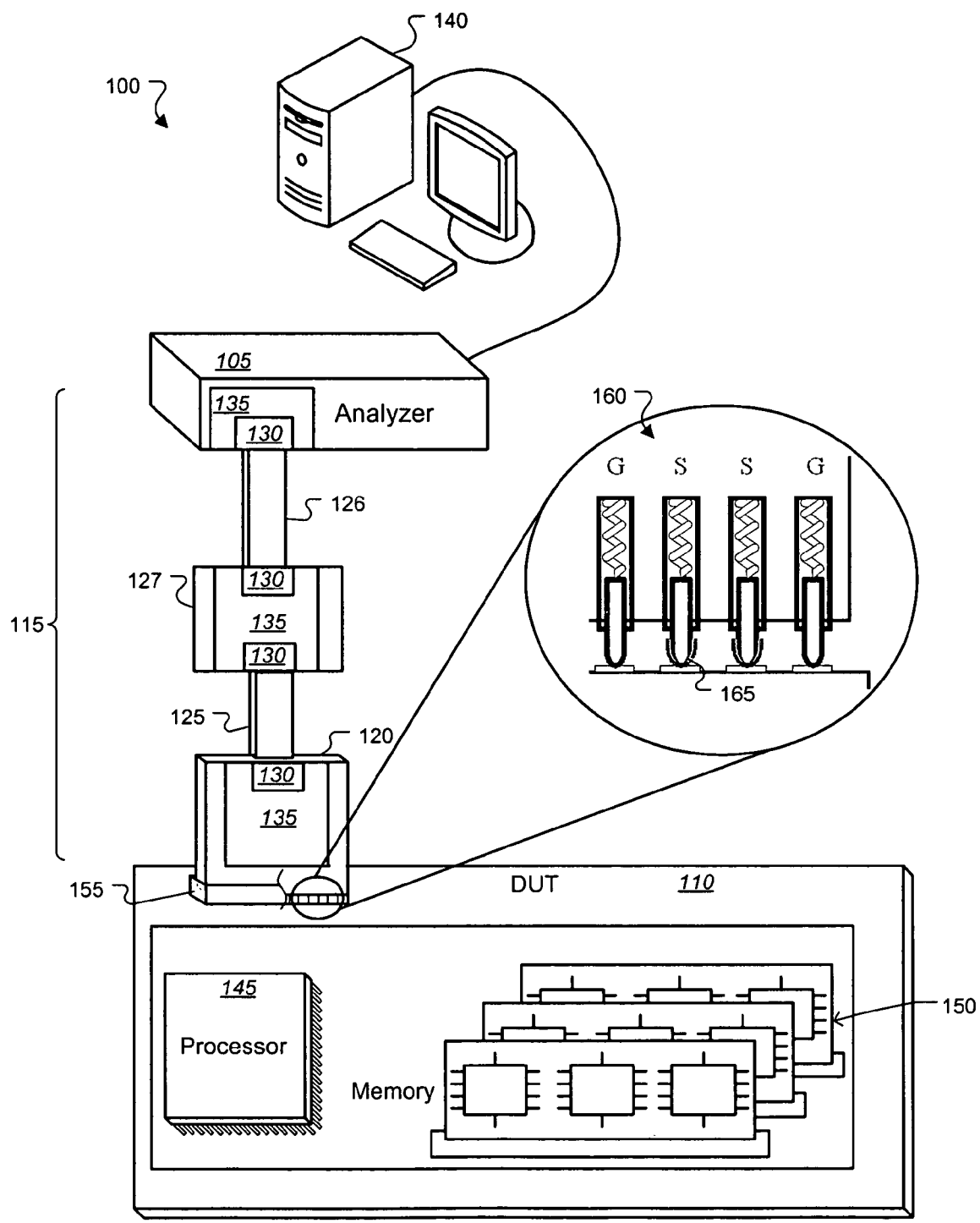
FIG. 1 shows an exemplary measurement system to measure high speed signals.

FIG. 1 shows an exemplary measurement system 100 for measuring one or more high speed channels. In some examples, this may include a waveform processing system, and may involve measuring high frequency (e.g., above about 5 GHz) analog signals and/or high data rate (e.g., above about 5 Gbits/sec) digital signals. The system 100 of this example includes an analyzer 105 to make measurements of a device under test (DUT) 110 that operates with high frequency signals. The system 100 includes a signal path 115 that connects the analyzer 105 to the DUT 110. The signal path 115 includes a probe 120, measurement cables 125, 126, and a repeater box 127. The probe 120 interfaces to the DUT 110 and taps a fraction of the DUT signals onto the measurement cable 125, which in turn conducts the signals to the repeater box 127. The repeater box 127 conditions (e.g., amplifies) the signals for transmission through the cable 126 to the analyzer 105. In some examples, the probe 120, repeater box 127, and measurement cables 125, 126 may conduct up to 16 or more high speed (e.g., 5 Gbits/sec or above digital, 5 GHz or above analog) single-ended and/or differential signals from the DUT 110 to the analyzer 105. The probe 120 further includes an interface 130 and a PCB transmission line 135. In some embodiments, the interface 130 and/or the PCB transmission line 135 may be implemented using a printed circuit board (PCB). In some embodiments, the interface 130 and/or the PCB transmission line 135 may incorporate one or more structures that improve integrity of signals that propagate from the DUT 110 to the analyzer 105, thus improving high speed signal measurements. Combinations of such features may, for example, increase the effective measurement bandwidth of a waveform processing systems, such as protocol analyzers and digital oscilloscopes. In some embodiments, improved bandwidth and/or signal integrity may be achieved using the interface 130 and/or the PCB transmission line 135 that, in some embodiments, may be implemented using a multilayer substrate fabricated from low cost, industry standard materials, such as FR-4.

Exemplary embodiments of the interface 130 and PCB transmission line structure 135 are described in further detail with reference, for example, to FIGS. 2-4B. In the depicted example, one of the interfaces 130 couples a signal from the transmission line PCB 135 in the probe 120 to the measurement cable 125. The signal propagates through the measurement cable 125 to another one of the interfaces 130, which is coupled to the transmission line PCB 135 in the repeater box 127. After being processed by some circuitry (not shown), another of the interfaces 130 couples the signal from the transmission line PCB 135 in the repeater box 127 to the measurement cable 126. Next, the signal propagates through the measurement cable 126 to another one of the interfaces 130, which is coupled to the transmission line PCB 135 in the analyzer 105. In other embodiments, a portion of at least some of the interfaces may be implemented using interfaces other than the interface 130.

In some cases, electrical properties of transmission line structures on PCBs, for example, may influence the achievable bandwidth of a measurement system, such as the measurement system 100. For example, high speed signals propagating along conventional transmission line structures in a PCB may degrade signal integrity by, for example, introducing dielectric losses, reflections, crosstalk, impedance discontinuities, resonances, or a combination of such effects. For example, impedance mismatches at a PCB-to-cable interface in the interface 130 may introduce reflections that reduce signal integrity in the propagating signal. Vias can introduce resonances that distort the propagating signal. Dielectric materials, which may include a fiberglass substrate layer and/or a polymer solder mask in regions between PCB traces, for example, may introduce dielectric losses that may attenuate the propagating signal. Dielectrics may also increase capacitive coupling that may, for example, increase propagation delay and/or cross-talk with other signals. As the frequency of the signal being measured increases, such as for frequencies above at least 1 GHz, the impact of such effects on the integrity of the signal to be measured may become more pronounced. In addition, high data rate systems may use low voltage signal levels, for example.

In the measurement system 100 depicted in FIG. 1, the analyzer 105 receives signals from the DUT 110 through the probe 120, the cable 125, the repeater box 127, and the cable 126. For example, the analyzer 105 may include an oscilloscope, a spectrum analyzer, a logic analyzer, a network analyzer, a protocol analyzer, and/or other signal measuring devices. In some examples, the analyzer 105 may perform signal processing operations on the received signals. For example, the analyzer 105 may convert analog signals to digital signals, reduce noise in the received signal, and/or amplify the received signals. In another example, the analyzer 105 may display digital signals in a coded format. In some examples, the analyzer 105 may also perform analytical operations on the received signals. In some embodiments, the analyzer 105 may decode the received signals according to a protocol, perform timing analysis (e.g., compute jitter information in the signals), and/or construct histograms using the received signals. For example, the analyzer 105 may perform about at least 5 Gbits/sec (per channel) PCI express traffic analysis.

The analyzer 105 is also connected to communicate with a computer 140. The analyzer 105 may transmit, for example, signal processing and/or analysis results to the computer 140. In some embodiments, the computer 140 may provide a user interface to display measurement results to a user, and may allow the user to control the analyzer 105. Also, the computer 140 may store the received results from the analyzer 105. In some systems, the computer 140 may transfer data between the analyzer 105 and a local area network (LAN) and/or a wide area network (WAN), such as the Internet.

The analyzer 105 may measures signals present the DUT 110. In this example, the DUT 110 includes a processor 145 and other electronic components 150, such as memory. Through the probe 120, the analyzer 105 may measure high speed signals propagating within the DUT 110, such as signals propagated between the processor 145 and one or more of the components 150. In some examples, the DUT 110 may be a telecommunication device or a computer network device that uses high speed signals to transmit digital data with data rate greater than 1 Gbit/sec or analog signals with frequency content up to at least 1 GHz. For example, the DUT 110 may use communication networks that implement standard protocols, such as a Synchronous optical networking (SONET) OC-768 specification, a Generation 2 Peripheral Component Interconnect (PCI) Express protocol, FireWire 400, Universal Serial Bus (USB) 2.0, Serial ATA (SATA) 6.0, HyperTransport bus, or other communication protocols. In other examples, the DUT 110 may include a switch-mode power supply that uses signals in or near the 5 kHz-2 MHz range. In some embodiments, the probe 120 may receive signals with data rates ranging from near DC to at least 150 Gbits/sec (e.g., 5-50 Gbit/sec) or from DC to at least 150 GHz (e.g., 5-50 GHz). In some embodiments, the probe 120 may receive signals having voltage magnitudes ranging from less than about 1 mV to at least about 10 V, such as between about 5 mV and 5 V, 10 mV and 3 V, or about 20 mV and 250 mV. In some embodiments, the probe 120 may also receive single-ended signals or differential signals (e.g., low voltage differential signals (LVDS)).

As shown, the probe 120 includes connector pins 160. The probe 120 interfaces to the DUT 110 through the pins 160. In some embodiments, the retainer 155 may be rigidly attached to the DUT 110. The retainer 155 may support the probe 120 and/or aid alignment of the probe 120 so that the connector pins 160 may make electrical contact to signal traces on the DUT 110.

In some embodiments, the connector pins 160 may include one or more resistive probe tips 165. For example, one or more connector pins 160 may provide series resistance in a resistive material coated on at least a highly conductive portion (e.g., metal) of one of the connector pins 160. The resistive coating may provide a resistance value that is effective to reduce and/or substantially control a degree of loading of the DUT 110 signal that is being measured. In some embodiments, the connector pins 160 may have low parasitic capacitance and/or inductance characteristics. In FIG. 1, the connector pins 160 are installed in the probe 120, which is secured within a plastic housing that is fastened to retainer 155, thus allowing pins 160 to make contact with traces on the DUT 110. Exemplary embodiments of the connector pins 160 are described in U.S. Pat. No. 6,863,576 ("Electrical Test Probe Flexible Spring Tip," issued to Campbell et al. on Mar. 8, 2005) and U.S. Pat. No.

6,650,131 ("Electrical Test Probe Wedge Tip," issued to Campbell et al. on Nov. 18, 2003), both of which were assigned to the assignee of the instant application. The disclosure of the detailed description portions and corresponding figures from U.S. Pat. Nos. 6,863,576 and 6,650,131 are incorporated herein by reference.

Signals received by the probe 120 are sent through the cable 125 to the repeater box 127. The received signals are conditioned by the repeater box 127 before being sent through the cable 126 to the analyzer 105.

In the probe 120, signals on the DUT 110 are received by the connector pins 160. The received signals propagate through the PCB transmission line 135 and the interface 130 to a distal end of the cable 125. A proximal end of the cable 125 connects to an input port of the repeater box 127. An output port of the repeater box 127 connects to a distal end of the cable 126. A proximal end of the cable 126 connects to an input of the analyzer 105.

The cables 125, 126 include one or more transmission lines for individual signals. Each such transmission line may be selected from, for example, a coaxial cable, tri-axial cable, twisted-pair cable, shielded parallel cable, flex circuit, a universal serial bus (USB) cable, or other type of cable to propagate high speed electrical signals.

In some embodiments, the repeater box 127 may apply a termination impedance substantially matched to the impedance of the cable 125, amplify the received signal, and then transmit the amplified signal through a source termination network substantially matched to the cable 126 impedance. In some embodiments, the repeater box 127 amplifies the received signals with an amplitude gain that may be greater than unity. In various embodiments, the signal gain within a bandwidth of interest may be, for example, −50, −3, 1.05, 10, or 25. In some embodiments, the amplitude gain may be substantially unity, such as either −1 or 1. In some embodiments, the amplitude gain may be less than unity.

The PCB transmission line 135 connects to the cable 125 through the interface 130. In various embodiments, the interface 130 may include physical structures for transitioning high speed signals from a PCB transmission line structure to a cable structure, or vice versa. The physical structure(s) implemented on the interfaces 130 may affect the impedance characteristics, for example, at various board-to-cable interfaces, such as the interface through which the signal transitions from the cable 125 to the repeater box 127 PCB, or the interface through which the signal propagates from the PCB transmission line 135 PCB to the cable 125. Exemplary board-to-cable interface structures for transitioning high speed signals propagating between a PCB transmission line structure and an transmission line off of the PCB are described with reference to FIGS. 2-4.

In the repeater 127, the PCB transmission line 135 may perform signal processing functions to improve measurement signal quality. For example, the PCB transmission line 135 in the repeater 127 may include filters and/or equalizers to compensate signal losses and/or to improve a signal-to-noise ratio in the received signals. In some embodiments, the PCB transmission line 135 in the repeater 127 may also include an amplifier stage that amplifies the received signals, and an amplitude gain of the amplifier stage may be, for example, substantially greater than unity. In an example implementation, the PCB transmission line 135 may amplify LVDS-type signals for transmission to the analyzer 105, which may be a protocol analyzer to measure and/or further process the signals. In some examples, the PCB transmission line 135 in the repeater may include multiple circuits to process the received signals.

Although only the DUT 110 is shown in FIG. 1, the system 100 may be arranged such that the analyzer 105 receives multiple channels from probes 7 at each of a number of locations on one or more DUTs (e.g., multiple PCI express lanes). If multiple probes are used, one or more repeaters 127 may receive and process the high frequency signals.

In some embodiments, the interface 130 and/or the PCB transmission line 135 may be implemented together on a PCB. In an embodiment of the repeater 127, for example, a single PCB may include the PCB transmission line 135 and two or more of the interfaces 130. In the example depicted in FIG. 1, the repeater 127 includes the transmission line 135 having an interface 130 at an input and an interface 130 at an output. In various embodiments, the repeater 127 may include more than one input interface 130 and/or more than one output interface 130. Each of the interfaces 130 may provide for more than one high frequency signal.

The PCB transmission line 135 may be implemented, for example, on a PCB by printing traces etched from copper or copper alloys laminated onto one or more layers of a dielectric substrate. In some examples, the interface 130 and the PCB transmission line 135 may be implemented using standard and/or non-standard materials for constructing a substrate, which may be a PCB, flex circuit, or ceramic substrate, for example. By way of example and not limitation, embodiments may be fabricated using materials that include FR-2, FR-4, Rogers 3000, Rogers 3200, Rogers 4000, Rogers Duroid, thermoplastic chloro-fluorocopolymer, thermoset ceramic loaded plastic, Teflon type GT or GX, polyimide, polystyrene and cross-linked polystyrene, aluminum, gold, silver, and/or ceramic materials. In some examples, the interface 130 and the PCB transmission line 135 may be implemented on single or multi-layer PCBs (e.g., 1-30 layers PCB). For example, the interface 130 and the transmission line PCB 135 may be fabricated on a multi-layer PCB (e.g., up to at least a 28-layer PCB).

In general, implementations may include conductors separated by dielectric materials. Distortion effects, such as dielectric losses and discontinuities, in the PCBs implementing the PCB transmission line 135 and the interface 130 may degrade measurement accuracy by, for example, slowing transition times and additional jitter that may lead to increased Inter-Symbol-Interference (ISI) and/or bit errors.

For example, high speed signals propagating through a board-to-cable interface (e.g., the interface 130) without sufficient impedance matching may experience substantial reflections. In some examples, adjacent and/or nearby channels may have sufficient stray electromagnetic coupling to experience substantial cross-talk. Effects such as mismatched impedances and cross-talk may degrade performance of measurement equipment and may produce measurement errors. To improve signal integrity for signals that propagate through transmission lines on PCBs, the transmission lines of the interface 130 and the PCB transmission line 135 may be fabricated using physical structures arranged to substantially reduce signal loss and/or distortion. In one example, the interface 130 and the PCB transmission line 135 may be implemented using a coplanar transmission line structure that is illustrated in FIG. 2.

Figure 2:
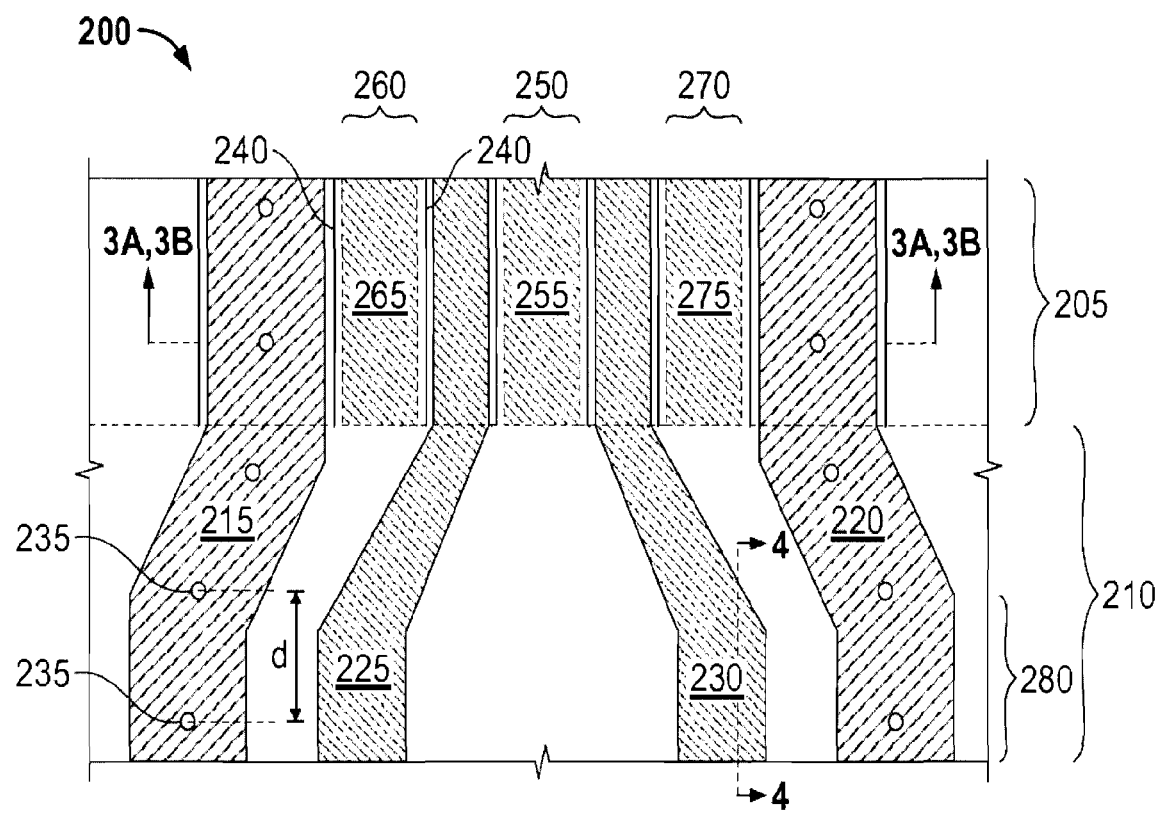
FIG. 2 shows a top view of an exemplary interface and transmission line structure for high speed signals.

FIG. 2 shows a top view of an exemplary coplanar transmission line structure 200 for high speed signal transmission. The structure 200 includes physical structures on a dielectric substrate that are configured to improve signal integrity, for example, by substantially reducing phenomena such as signal reflections, resonances, and/or signal attenuation for high frequency signals.

In some embodiments, various connections in the system 100 may includes a transmission line structure, such as the transmission line structure 200. Such connections may include, but are not limited to, the connections between the probe 120 and the cable 125, the cable 125 and the repeater 127, the repeater 127 and the cable 126, or the cable 126 and the analyzer 105. For example, one or more of these connections may include embodiments of the interface 130 and/or the PCB transmission line 135.

Integrity of high frequency signals propagating through the structure 200 may be improved, for example, by implementing one or more structures, either singly or in combination. Examples of such structures include, but are not limited to, trenches in a dielectric substrate layer between the traces, reduced solder mask thickness in the regions between the traces, etched portions of one or more ground plane layers in the connector pad region under a board-to-wire connector, and restricted spacings between vias.

In this example, the structure 200 includes a transmission region 205 and a transition region 210. The transmission region 205 may be part of a transmission line on a PCB, such as the PCB transmission line 135. The transition region 210 may be part of a PCB-to-cable interface, such as the interface 130, which may in turn be coupled to the cable 125. The cable 125 may include a connector structure coupled to the interface 130 via the transition region 210. In another example, the transition region 210 may be coupled to the connector pin 160. In some embodiments, the transition region 210 may be dimensioned to accept a board-to-wire, board-to-board, or other type of connector.

In the depicted example, the structure 200 includes a differential coplanar transmission line structure implemented in a ground-signal-signal-ground (GSSG) configuration. The structure 200 includes two ground traces 215, 220 and two signal traces 225, 230. Differential signals may propagate in the traces 215, 220, 225, 230. In some embodiments, techniques described here may also be applied to implement other transmission structures, such as a transmission line with a ground-signal-ground-signal-ground (GSGSG) configuration. For example, the interface 130 may include a GSGSG structure with an additional inner ground between the two signal traces 215, 220 to facilitate connection to a coaxial cable. Some embodiments may also be implemented as transmission lines for single-ended signals. For example, the interface 130 may include a ground-signal-ground (GSG) configuration transmission line structure.

For example, the structure 200 may be in the form of micro strip transmission line structure where only the signals are on the outer layers 355 and the ground either directly underneath it 365 or on different layers incorporating the etched ground feature. A micro strip transmission line structure.

The ground traces 215, 220 in the structure 200 include vias 235. The vias 235 connect the ground traces 215, 220 to one or more reference potential (e.g., ground) conductors, which may be implemented substantially in one or more planar layers of a PCB separated from the conductor by, for example, one or more dielectric layers. In general, reference potential planes in other layers may provide a reference potential accessible to each layer in the multi-layer PCB through one or more via connections made through the dielectric layer(s). For example, some vias may connect to multiple reference potential planes. The substantially equal ground potential in the structure 200 may allow flexibility to accommodate different structures for connecting the structure 200 to the cable 125.

In addition to providing for substantially equal potentials between the ground traces 215, 220 through connection to one or more ground planes, the vias 235 may further be arranged to substantially prevent exciting resonant modes along the structure 200. Such arrangement may include, for example, restricting the maximum spacing between adjacent ones of the vias 235 to less than about a quarter wavelength of a highest frequency within a frequency range of interest. By way of example and not limitation, a frequency range of interest may include frequencies to at least about 300 GHz.

In some embodiments, a spacing between the vias 235 may affect the signal quality in the transmission line structure 200 due to resonance phenomena. For example, the resonance phenomena may be substantially reduced or mitigated by limiting the spacing between adjacent ones of the vias 235 in a conductor to be less than a quarter wavelength of the propagating signal. For signals containing energy at multiple frequencies, various embodiments may be configured such that the vias 235 are spaced such that adjacent vias are no more than about a quarter wavelength of the highest frequency of interest. In some embodiments, a substrate may be fabricated according to a design rule that restricts a spacing of vias in a region of a conductor to substantially less than a quarter wavelength of the highest frequency of the signal or in a frequency band of interest. In some embodiments, the spacing may be reduced from a full quarter wavelength by a factor, such as 0.95, 0.5, 0.2, 0.1, or 0.05, for example. In one implementation, a computer program product tangibly embodied in a data store containing instructions that, when executed by a processor, may cause the processor to perform an automated layout design process of selecting locations for a number of vias in a designated region of a selected conductor according to one or more such design rules.

In general, excitation of a resonant mode may lead to attenuation and/or distortion of the propagating signal. If the resonant frequency associated with the spacing between adjacent vias in a conductor is at 10 GHz, then propagating signals with frequency components near 10 GHz may be substantially attenuated or distorted. To avoid attenuation of the propagating signals from resonant effects, the distance of two adjacent vias 235 ("d" in FIG. 2) may be selected so that a first resonant frequency associated with the via spacing is substantially greater than the frequency band of interest by making the spacing between the vias 235 less than or substantially less than, for example, a quarter of the wavelength of the propagating signal.

For example, the structure 200 may be designed for signals propagating at 50 GHz. Spacing between adjacent vias (d) may be maintained less than "d" such that the first resonant frequency is above 50 GHz, such as 100 GHz, for example.

In the transmission region 205 depicted in FIG. 2, the structure 200 further includes a gap 250 between the signal traces 225, 230, and two gaps 260, 270 between the signal trace 225 and the ground trace 215, and the signal trace 230 and the ground trace 220, respectively. Also, the transmission region 205 includes solder masks 240 covering the traces 215, 220, 225, 230. The solder masks 240 may protect the traces 215, 220, 225, 230 from oxidation.

Substrates in the gaps 250, 260, 270 and the solder masks 240 may introduce dielectric loss in the propagating signal. In some embodiments, most of the electromagnetic fields of the propagating signal may concentrate in the gaps 250, 260, 270. For example, the electromagnetic fields may propagate between the traces 215, 220, 225, 230 through the solder masks 240 and the substrate between the traces 215, 220, 225, 230. Dielectric materials (e.g., the solder mask material, and/or the fiberglass substrate of the PCB) in the gaps 250, 260, 270 may affect quality of the propagating signals. For example, electric fields and magnetic fields of the propagating signals in the structure 200 may be attenuated in the substrate of the multi-layer PCB due to losses in the PCB dielectric material.

The structure 200 further includes trenches 255, 265, 275 to allow the fields to be mostly concentrated in air to reduce signal loss in the substrate. The trenches 255, 265, 275 are developed between signal-to-signal and signal-to-ground traces. As shown in this example, the trench 255 is constructed in the gap 250, the trench 265 is constructed in the gap 260, and the trench 275 is constructed in the gap 270. In some examples, the trenches 255, 265, 275 may have equal width. In other examples, the trenches 255, 265, 275 may have different width within the gaps 250, 260, 270, respectively. For example, the trenches 255, 265, 275 may be etched from an edge of one trace to an edge of an adjacent trace. In some embodiments, the widths of the trenches 255, 265, 275 may be set to give a desired characteristic in the transmission line structure 200. For example, the trenches 255, 265, 275 may have different widths to provide a specific termination resistance (e.g., 100 Ohm for differential signal lines, 50 for single-ended signal lines).

Accordingly, integrity of high frequency signals propagating through the structure 200 may be improved by implementing one or more structures, either singly or in combination. Such structures may include, but are not limited to, trenches in a dielectric substrate layer between the traces 215, 220, 225, 230, reduced solder mask thickness in the regions between the traces 215, 220, 225, 230, etched portions of one or more ground plane layers in the region 280, and restricted spacings between vias.

In the trenches 255, 265, 275, the electromagnetic fields may traverse through substantially open space (e.g., air) in the gaps 250, 260, 270. This may effectively reduce the dielectric constant between the conductors. Thus, the trenches 255, 265, 275 may yield reduced dielectric loss in propagating signals. Examples of some trench configurations in the structure 200 are described in additional detail with reference to FIGS. 3A-B.

Selective patterning of the solder masks 240 may also improve signal quality in high speed signal propagation in a multi-layer PCB. Some solder mask materials, such as Taeyo PSR4000, may have a high dielectric constant of approximately 4.5 and high loss tangent of nearly 0.03, which may result in signal losses of the electromagnetic field strengths in the solder masks 240. The presence of the solder masks 240, especially in the gaps 250, 260, 270 where most electromagnetic fields are concentrated in, may attenuate propagating signals. To reduce signal attenuation, the structure 200 includes partial instead of entire solder masking in the transmission area 205. In one embodiment, the solder masks 240 covers substantially only the ground and signal traces 215, 220, 225, 230, and is substantially not present in the gaps 250, 260, 270. As such, the solder mask thickness may be reduced in at least a portion of a region that extends between conductors. In other embodiments, other solder masking configurations may be used to reduce loss in the solder masks 240. Examples of some solder masking configurations in the structure 200 are described in additional detail with reference to FIGS. 3A-B.

Etching of the conductor (e.g., copper) of a reference layer (e.g., ground plane) in the transition region 210 may also improve signal integrity, for example, by reducing capacitance in the transition region 210. This may provide for improved impedance matching within the transmission region 205. As shown in FIG. 2, the structure 200 includes a region 280 for connector or cable attachment. In some embodiments, the traces 215, 220, 225, 230 at the region 280 may be wider than the traces 215, 220, 225, 230 at other portions to accommodate connectors (e.g., the connector pins 160 or the cable 125), causing an increase of a capacitance at the region 280 and a mismatch of transmission line impedance in the transition region 210.

To reduce the capacitance, a distance between at least a closest ground plane and the structure 200 may be increased. For example, one or more ground planes (not shown) in the transition region 210 closest to the structure 200 may be etched. Exemplary structures with the closest ground planes partially and/or substantially removed from the transition region are described in additional detail with reference to FIGS. 4A-B.

Figure 3A:
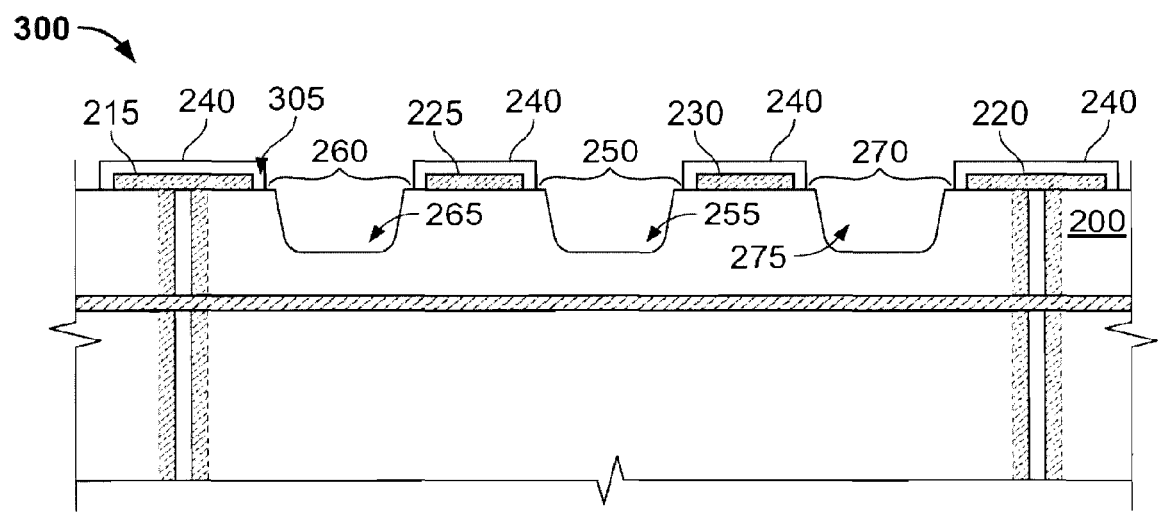
FIGS. 3A-3B show cross-sectional views of an exemplary high speed transmission line structure.
Figure 3B:
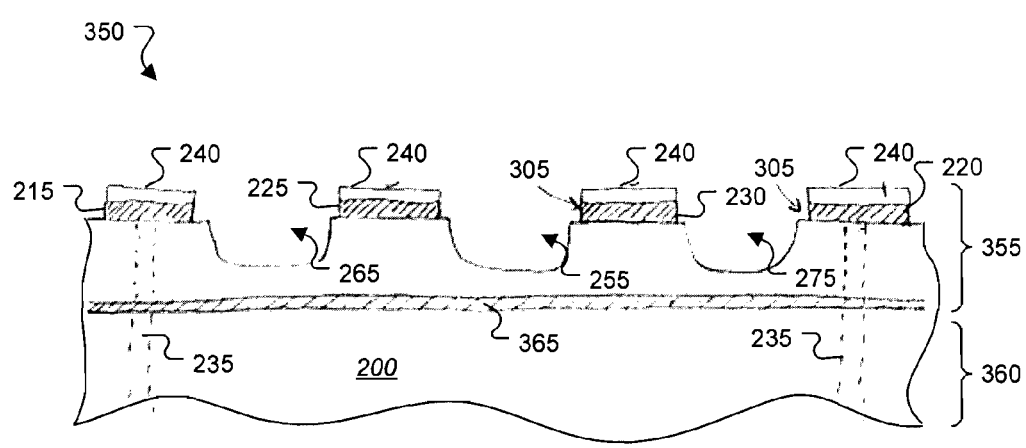

FIGS. 3A-B show cross-sectional views along a line 3A, 3B of the transmission line structure 200. Two configurations 300, 350 are depicted to describe exemplary implementations of the trenches 255, 265, 275 in the transmission line structure 200 as described with reference to FIG. 2. In various embodiments, the trenches 255, 265, 275 may reduce signal loss in dielectric materials by reducing the amount of dielectric material in the regions between the traces 215, 220, 225, 230.

The dielectric loss in the transmission structure 200 may be reduced depending on the depth of the trenches 255, 265, 275. For example, if the trench 255 is deep enough such that the electromagnetic fields between the signal trace 225 and the ground trace 215 are disposed substantially in open space (e.g., air), then the dielectric loss in the substrate may be substantially reduced.

As shown in FIG. 3A, the substrate in the gaps 250, 260, 270 may be etched by using, for example, a wet etching solution Potassium Hydroxide (KOH). Etching may also be performed using a plasma. Fore example, CF4/N2/O2 gas through Reactive Ion Etcher (RIE)-based dry etch process may be used. Conventional equipment to provide optical alignment are widely available. Using the standard etching process, the depth of the trenches 255, 265, 275 may be controlled.

By etching the substrate in the gaps 250, 260, 270, the solder masks 240 originally covering the gaps 250, 260, 270 are also removed. For example, the solder masks 240 may be first developed to cover the surface of the structure 200, including the gaps 250, 260, 270 and the signal traces 225, 230. Reducing solder mask coverage in the gaps 250, 260, 270 may reduce dielectric constants and improve signal integrity of the propagating signals in the signal traces 225, 230. In some embodiments, further reduction of the solder masks 240 may be done to further improve signal quality in the signal traces 225, 230. For example, the solder masks 240 covering a sidewall portion 305 of the traces 225, 230 may be removed as described with reference to FIG. 3B.

As shown in FIG. 3B, the sidewall 305 portion of the solder masks 240 are etched. Partial solder masking of the traces 215, 220, 225, 230, may further reduce the dielectric loss and improve signal quality. In another embodiment, to further reduce signal loss due to of the presence of the solder masks 240, other solder mask materials with characteristics such as reduced effective dielectric constant, for example, may also be used. Soldermask materials may include, for example, liquid photo-imageable Polyimide R8080 available from Rogers Corporation of Connecticut.

In some embodiments, a protection (e.g., passivation) layer may be deposited on surfaces from which solder mask is not present. Such surfaces may include, for example, sidewalls. Such a protection layer may substantially reduce or prevent oxidation of materials such as the metal (e.g., copper) conductor. For example, a thin passivation or coating layer may include gold, silver, or other protective material that is less susceptible to oxidation and/or corrosion, for example. Such a protective layer may be coated or deposited (e.g., using electroplating) on surfaces that may include at least the exposed sidewall portion 305 of the traces 215, 220, 225, 230.

In some embodiments, increasing signal trace thickness may reduce conductor loss in the signal traces 225, 230 to improve signal integrity. For example, the thickness of the signal traces 225, 230 can be increased by increasing the plating time of the conducting materials.

In various embodiments, other combinations of the above techniques may be used. For example, PCBs may incorporate one or more of the above-described structures or techniques. In some examples, a transmission line structure may be constructed with etched trenches but no removal of solder mask to reduce some dielectric loss in the gaps between the traces. In other examples, a transmission line structure may be constructed on a PCB without the trenches but with solder mask materials substantially removed from at least a portion of region that extends between the traces. In other examples, some transmission line structures may be constructed by etching and removing substantially all solder mask material from a region extending between the traces and at the sidewall portions and with no trenches in the gaps. In other examples, a transmission line structure may be constructed using conductors with increased thickness without the trenches 255, 265, 275.

As shown in FIG. 3B, the structure 200 includes an outer layer 355 and an intermediate layer 360. In other embodiments, the structure 200 includes top and bottom outer layers and may include one or more intermediate layers. The ground traces 215, 220 and the signal traces 225, 230 are constructed on the outer layer 355. In the intermediate layer 360, the structure 200 includes a ground plane 365 that is closest to the traces 215, 220, 225, 230. To maintain a substantially equal ground potential at the ground traces 215, 220 and the ground plane 365, the vias 235 are established to connect the ground traces 215, 220 to the ground plane 365.

In some embodiments, the ground plane 365 may be close to the traces 215, 220, 225, 230 to reduce a thickness of the PCB causing the capacitance at the region 280 to be greater than other portion of the transmission line. Additionally, the region 280 in the transition region 210 may be wider than other portions of the traces 215, 220, 225, 230, causing further increase in the capacitance at the region 280 relative to other portion of the transmission line structure 200. The higher capacitance at the transition region 210 may create an impedance mismatch in the transmission line and introduce distortion, such as reflections, in propagating signals. To reduce the impedance mismatch, one or more ground planes closest to the outer layer 355 may be etched to increase the distances between the traces 215, 220, 225, 230 and a closest ground plane. In one example, the ground plane 365 may be etched to improve signal integrity that is illustrated in FIGS. 4A-B.

Figure 4A:
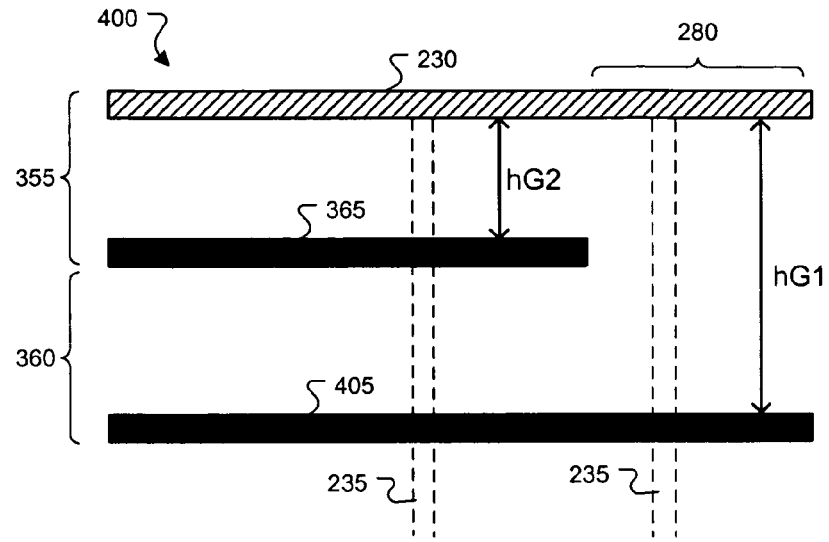
FIGS. 4A-4B show side and perspective cross-section views of exemplary high speed transmission line structures.
Figure 4B:
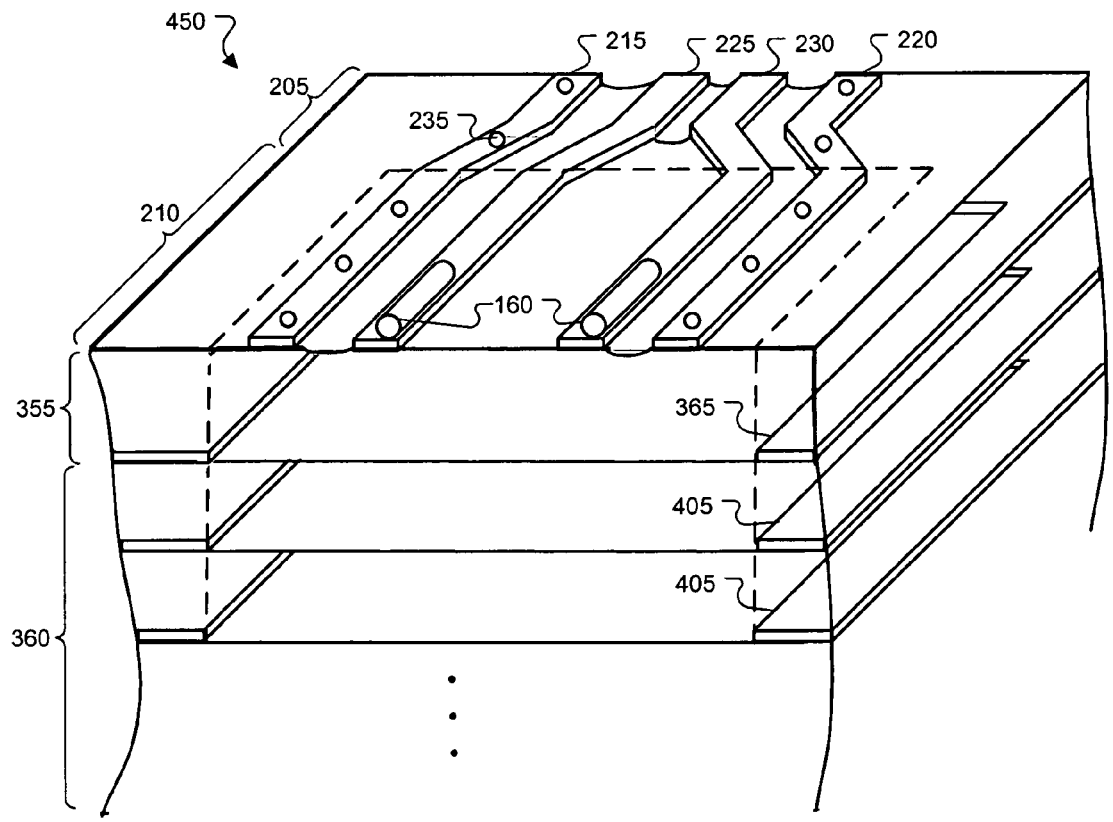

FIG. 4A is a side view along the line 4,4 of the transition region 210 showing an exemplary interface 400. The interface 400 includes the region 280 for connecting to a connector pin or a cable. In this example, the ground plane 365 closest to the trace 230 is partially etched underneath the region 280. As described with reference to FIG. 2, the region 280 may be wider than the rest of the trace 230 causing the capacitance at the region 280 to be greater than the rest of the trace 230. By partially etching the ground plane 365 underneath the region 280, the distance between a closest ground plane to the trace 230 may be increased. In some examples, the capacitance at the region 280 may be reduced to match the impedance of the transmission line. When the transmission line is impedance matched at the pad, the signal quality is improved.

In this example, the ground plane 365 is located at the bottom of the outer layer 355. As shown, the distance between the trace 230 and the ground plane 365 is hG2. To reduce capacitance at the region 280, the ground plane 365 is etched underneath the region 280. In this example, the interface 400 includes a ground plane 405, which is a next closest ground plane from the region 280. The ground planes 365, 405 may be connected by a via array that includes a plurality of the vias 235 spaced apart no more than about a quarter of a wavelength of the propagating signal. As a result of the etching, a distance between the region 280 and the closest ground plane (e.g., the ground plane 405) is hG1, which is greater than hG2. Because the capacitance is inversely related to the distance between two conductors, the capacitance at the region 280 is reduced by the increased distance between the region 280 and the ground from hG1 to hG2.

In some embodiments, ground planes at one or more other layers in the intermediate layers 360 may be etched to achieve the required capacitance. For example, one or more next level ground planes (e.g., the ground plane 405) underneath the region 280 can also be etched until the capacitance at the region 280 reaches a desired level such that the impedance matches the impedance of the transmission line. For example, if the capacitance at the region 280 with the distance hG1 is too short to match the impedance of the transmission line, then the ground plane 405 and possibly more ground planes below the ground plane 405 may be substantially removed to a distance hG3 so as to provide a desired capacitance at the region 280.

In some embodiments, one or more ground planes may each be etched to a distance from an edge of the PCB substantially as far as needed to achieve the desired level of capacitance. For example, the ground plane 365 may extend to a point 410 to further reduce capacitance in the interface 400.

FIG. 4B shows an example of a multi-layer PCB 450 that includes the interface 400. In this example, the multi-layer PCB 450 includes more than one intermediate layers 360. As shown, the ground plane 365 in the outer layer 355 and one or more of the ground planes 405 in the intermediate layers 365 in the transition region 210 are etched to reduce capacitance and obtain impedance match in the transition region 210. By matching the impedance in the transition region 210, signal distortions, such as signal reflections, may be reduced and signal quality may be improved.

The multi-layer PCB 450 includes the connection pins 160 that are connected to the signal traces 225, 230. For example, the connector pins 160 may be soldered onto the multi-layer PCB 450. To accommodate the connector pins 160, the transition region 210 may be wider than the transmission region 205 of the multi-layer PCB 450, causing an increase in the capacitance of the transmission line structure.

As shown, the ground plane 365 directly beneath the outer layer 355 may be etched under the transition region 210 to reduce capacitance and/or match the transmission line impedance. In some embodiments, more than one ground planes, including the ground plane 365, may be etched to obtain a desired capacitance reduction. For example, some of the ground planes 405 may be etched to provide adequate capacitance reduction to match impedance in the transition region 210.

In some embodiments, the technique of partially etching the ground plane 365 may be used with some or all of the other techniques described above. In other embodiments, the technique of etching the ground plane 365 partially may be used alone without other techniques described above. For example, the structure 200 may include the interface 400 and may also include trenches constructed between the traces 215, 220, 225, 230, and solder masks removed from the gaps 250, 260, 270 and sidewalls of the traces 215, 220, 225, 230. In some embodiments, a transmission line structure without trenches may include the etched ground plane 365 with solder masks removed substantially only from the gaps 250, 260, 270, but substantially remaining on the sidewall portion of the traces 215, 220, 225, 230. In some examples, a transmission line structure may include one or more partially etched ground planes, and signal trace conductors with increased thickness.

Dimension and thickness of the traces 225, 230, the thickness of 355 and the etched solder mask in 215, 225, 230 and 220, the trenches 265, 255, and 275 may be designed to give the desired characteristic impedance of 210 and 205, which may be, for example, 100-Ohms for differential and 50-Ohms for single-ended configurations. Combinations of techniques such as partially etching of the ground plane, varying trace thickness, and varying trace widths may be used to improve impedance-matched characteristic at board-to-wire interfaces, for example.

In some embodiments, the interface 130 and the PCB transmission line 135 may also incorporate some or all of the described techniques in various combinations to improve signal integrity. For example, the PCB transmission line 135 may include vias that are spaced to set a first resonant frequency to be substantially greater than the frequency band of interest. In some examples, the PCB transmission line 135 may include a coplanar transmission line structure having trenches between signal-to-signal traces and/or signal-ground trances. In some examples, the PCB transmission line 135 may include a coplanar transmission line structure having solder masks removed between signal-to-signal traces and/or signal-ground trances. In some examples, the PCB transmission line 135 may include a coplanar transmission line structure having solder masks removed between signal-to-signal traces and/or signal-ground trances and at sidewall of the traces. Additionally, the coplanar transmission line may include oxidation protection layer (e.g., thin films of gold or silver) at the sidewall of the traces to prevent oxidation at the traces where solder masks at sidewalls of the traces are removed. Also, the transmission line may include signal traces with increased width so as to reduce conductor loss. In some examples, the PCB transmission line 135 may include a transmission line structure having one or more ground planes at least partially etched under a wire-to-board or other off-board interface, which may be to a connector pin or a cable, for example.

Various embodiments have been described as providing conductive structures. Conductive structures may be formed from various materials using various processes. Examples of some conductive materials that may be used to form conductive structures include copper, gold, silver, and/or nickel. Examples of processes that may be used to form conductive structures include sputtering, electroplating, and laminating.

In some examples, some or all of the described techniques may also be applied to substrates, such as in ceramic substrates or in flex circuit cables. For example, trenches and solder mask removal may be used to fabricate circuit elements using a ceramic substrate. In another example, some flex circuit cables may use some of the described techniques, including but not limited to via spacing restriction and/or etching of ground plane layers under a connector pad region so as to reduce distortion in the propagating signals.

In some embodiments, a measurement cable and associated interfaces between a DUT and a signal waveform analyzer or waveform processor may include one or more conductors in addition to those configured to operate as a high speed signal path. Such additional conductors may be used for purposes such as electromagnetic compatibility, for example, which may include, but is not limited to, one or more shielding conductors, reference or ground potential conductors, and/or safety ground (e.g., potential earth). Some embodiments may further include lower speed signals, such as power and return conductors, voltage references, control signals, or other signals that may be used for circuit operation or for purposes of exercising and/or measuring the DUT.

Figure 5:
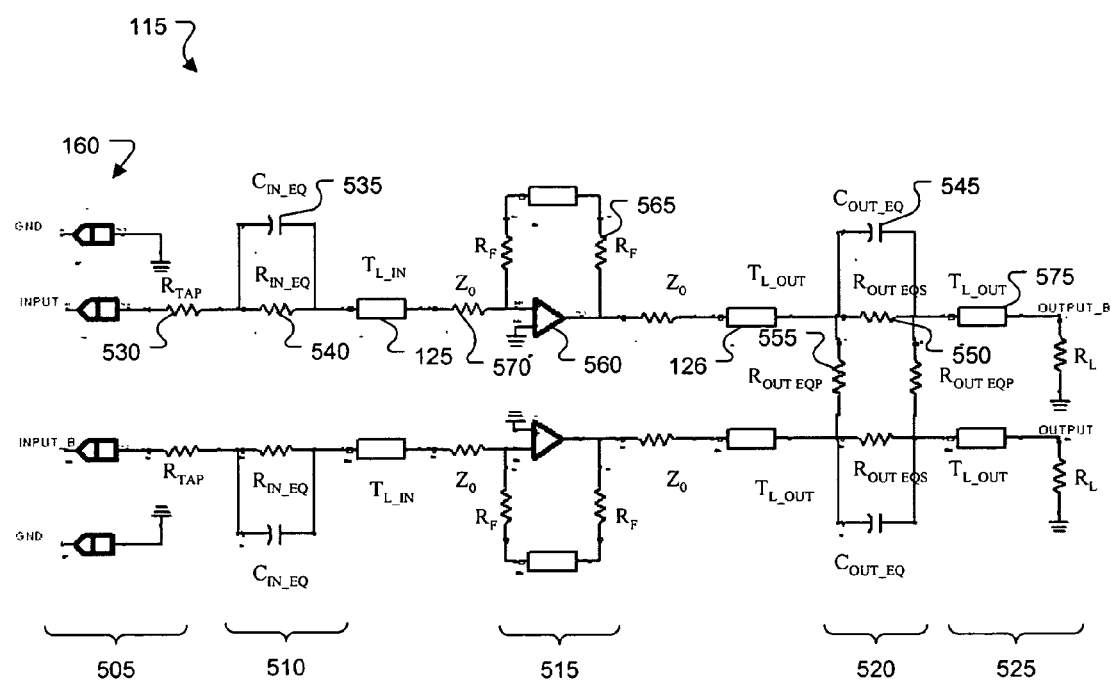
FIG. 5 shows an example electrical circuit representation of a signal path for high speed signal propagation.

FIG. 5 shows an example of a circuit representation of the signal path 115 for receiving signals from the DUT 110 and propagating the received signals to the analyzer 105. In this example, the signal path 115 includes an input stage 505, an input equalizer 510, a termination stage 515, an output equalizer 520, and an output stage 525. The received signals may propagate from the input stage 505 to the output stage 525 through the cable 125 between the probe 120 and the repeater box 127, and the cable 125 between the repeater box 127 and the analyzer 105. In some embodiments, the termination stage 515 may be located remotely (e.g., in the repeater box 127) from the probe 120 such that the size of the distal portion of the probe 120 may be reduced.

The input stage 515 includes the connection pins 160 and tap resistors 530 of the probe 120. The tap resistors 530 may reduce loading of the received signals. Additionally, parasitic capacitance and inductance at the contact between the DUT 110 and the signal path 115 may be reduced by directly contacting the tap resistors with the DUT 110.

In some embodiments, an example of which may relate to the pins 160 described with reference to FIG. 1, the tap resistors 530 may include a resistive material that may be applied (e.g., coated) on one or more tips of the connection pins, such as the resistive probe tips 160. The resistance of coatings applied to a metallic probe pin may be controlled, for example, using processes that may include, but are not limited to, chemical vapor deposition or electron beam evaporation. In some embodiments, the tap resistors 530 may be integrated entirely on the pins 160, or integrated partially on the tips of the connection pins 160 and partially in the PCB transmission line 135 (e.g., as a printed resistor, surface mounted resistor, etc . . . ). For example, one of the tap resistors 530 may be implemented in part by resistive material coated on the tip of the corresponding connection pin 160 and in part with one or more circuit elements in the PCB transmission line 135. In one example, the input stage 515 may include resistors of high precision implemented in the circuit and a layer of coated resistive material with lower precision on the tips of the connection pins 160. Such embodiments may advantageously reduce high frequency (e.g., capacitive) loading effects while allowing the series resistance to be partial in the resistance of the tap resistors 530 may be reduced. Various embodiments are described in additional detail with reference to FIGS. 9A-9B.

The input equalizer 510 is a single-ended pi equalizer that includes capacitors 535 and resistors 540. In some embodiments, the input equalizer 510 may form a high pass filter (HPF) that may at least partially compensate for high-frequency signal losses associated with the cables 125 and the PCB traces (e.g., the traces 215, 220, 225, 230). For example, there may be some signal attenuation in the PCB traces. In some embodiments, an equalizer may substantially flatten the frequency response by introducing high-pass filter like response to compensate the low-pass filter-like response of the channel caused by losses, such as the interconnect losses. By reducing the signal losses, the input equalizer may reduce ISI and improve bit error rate (BER). In various embodiments, the resistors 540 and/or the capacitors 535 may be omitted.

In some embodiments, the input equalizer 510 may be in the probe 120, such as in the PCB transmission line 135. In other embodiments, the input equalizer 510 may be in the repeater box 127. For example, the received signals may propagate through the input stage 505 and the cable 125 before reaching the input equalizer 510. In some embodiments, the input equalizer 510 may be adjustable by tuning the capacitance of the capacitors 535 and resistance of the resistors 540. For example, a manufacturer may tune the resistance values in the output equalizer 520 to improve signal quality by laser trimming the resistors 540.

The output equalizer 520 includes capacitors 545, series resistors 550, and parallel resistors 555. The parallel resistors 555 may match the input and output impedance of the output stage 525 to reduce signal reflections. In this example, the output equalizer 520 is a differential pi equalizer that compensates high-frequency losses (e.g., due to the cable) in the output stage 525. In some embodiments, the output equalizer 520 may be adjustable. For example, the parallel resistors 555 may be variable resistors that are adjustable to adjust the bandwidth of the output equalizer 520.

In some embodiments, the equalizers 510, 520 may be manufactured as discrete elements that may be mounted on a PCB. For example, the input equalizer 510 may be manufactured in a chip structure to be placed on top of a PCB in the repeater box 127. Some examples of the chip structure implementing the input equalizer 510 are described with reference to FIG. 6. Some examples of the chip including the output equalizer 520 are described with reference to FIGS. 7A-E.

The termination stage 515 includes dual high-speed op-amps 560 and feedback resistors 565. In this example, a reference voltage (e.g., a ground potential) is established at positive inputs of the op-amps 560 so that negative inputs of the op-amps 560 may be established as a virtual ground. For example, termination resistors 570 connected to the negative inputs of the op-amps 560 may provide termination for an input transmission line, including the cables 125, the interface 130, and the PCB transmission line 135.

A gain in the termination stage 515 may be related to a ratio between the resistance of the feedback resistors 565, the resistance of the tap resistor 530, and the resistance of the termination resistors 570. Here, the termination stage 515 may amplify the received signals using the feedback resistors 565, the tap resistors 530, and the termination resistors 570. In one example, the termination stage 515 may amplify the received signals when the feedback resistors 565 have resistance greater than the sum of the resistance of the tap resistors 530 and the termination resistors 570. In another example, a manufacturer may set the resistance of the feedback resistor 570 to be substantially equal to the sum of the resistance of the termination resistor 570 and the tap resistor 530 to give a unity gain in the termination stage 515.

In some embodiments, the non-inverting terminal may receive a voltage other than ground, such as a voltage from a voltage reference source or a sinusoidal signal containing phase information.

In some embodiments, an operational amplifier circuit in the termination stage 515 may be implemented as an integrated circuit. In some embodiments, the termination stage 515 may include an integrated chip and some discrete electrical elements. Some examples of implementations of the termination stage 515 are described with reference to FIG. 8.

The output stage 525 includes a transmission line 575 and termination resistors $R_L$. In some embodiments, the output stage 525 may be incorporated into the analyzer 105. Optionally, the equalizer 520 may be incorporated into the analyzer 105. In some examples, the transmission line 575 may include a cable or PCB traces. The analyzer 105 may receive signals from the output stage 525.

Some or all of the electrical components in the signal path 515 may be constructed on a PCB, which may be in the form of 210 and 205. Components including the equalizer 520 may be included in the repeater 127. In some embodiments, one or more portions of the signal path 115 may be constructed on one or more PCBs that have transmission lines manufactured using various combination of techniques described with reference to FIGS. 2-4. For example, some portions of the signal path 115 may include trenches removed at zones between coplanar traces. In some examples, some portions of the signal path 115 may have solder mask materials at least partially removed from a zone extending between traces and/or at the sidewall portion of the signal traces. Additionally, a protective layer (e.g., a thin film of gold) may be flashed on conductor surfaces, which have solder masks removed, to protect the conductor from oxidation. In some examples, the ground traces at some coplanar transmission lines in the signal path 115 may include vias spaced such that the first resonant frequency is substantially greater than the frequency band of interest. In some examples, ground planes at board-to-cable interfaces (e.g., an interface of the input equalizer 510 and the cable 125, an interface of the cable 125 and the termination stage 515, an interface of the termination stage 515 and the cable 125, and/or an interface of the cable 125 and the output equalizer 520) may be etched to reduce capacitance at the interfaces.

Figure 6A:
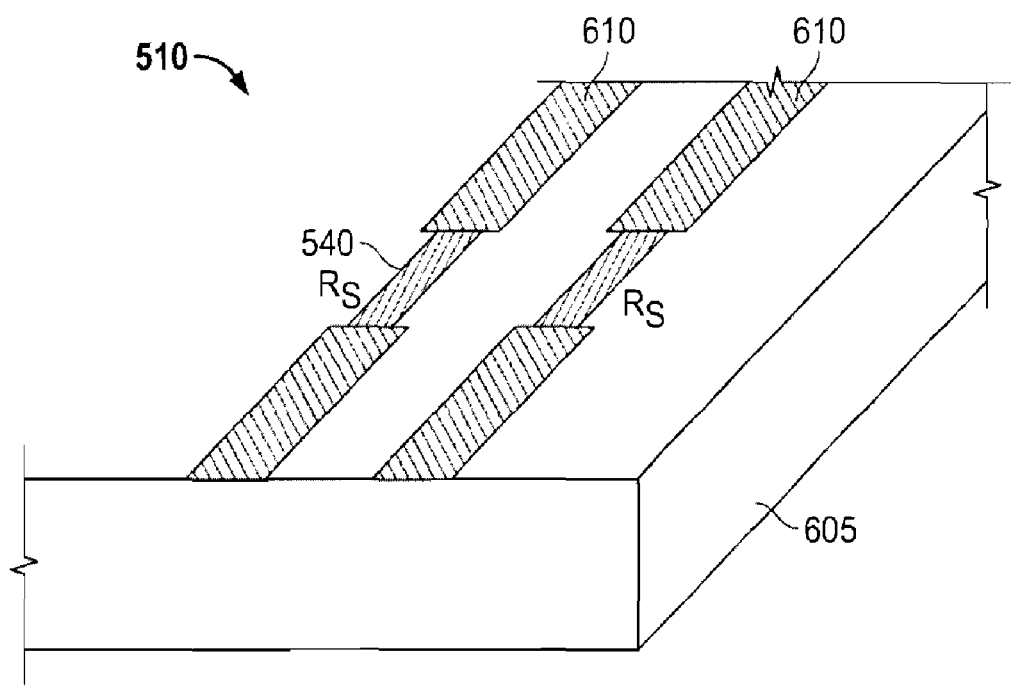
FIGS. 6A-6B show an example equalizer implementation.
Figure 6B:
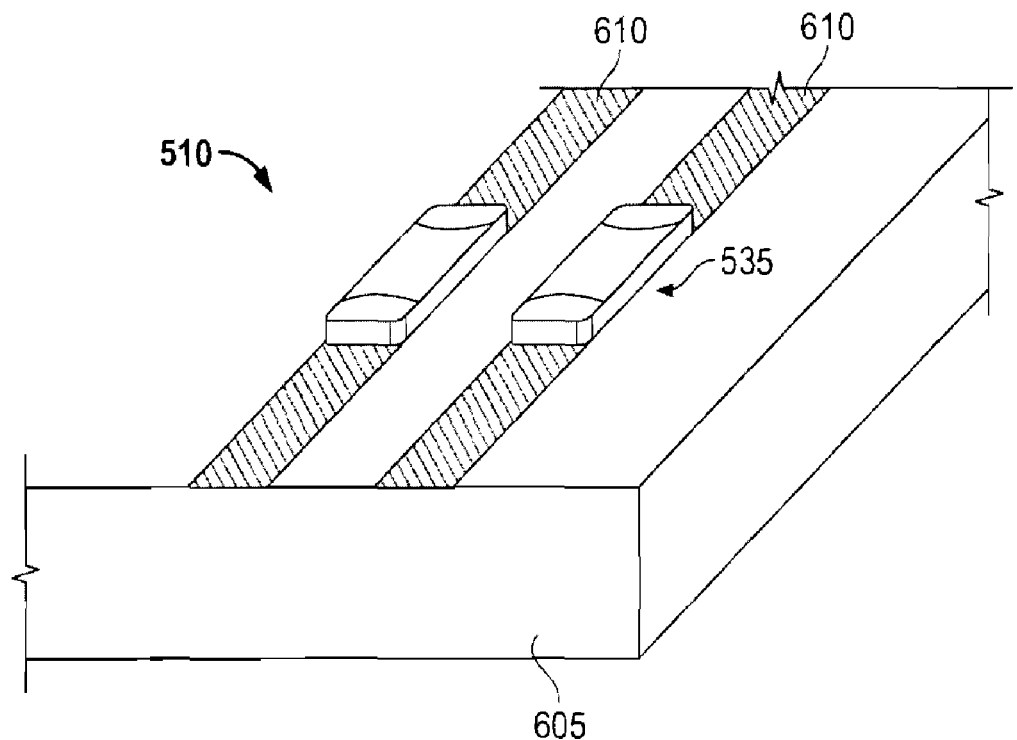

FIG. 6 shows an example of the input equalizer 510 that is implemented using integrated resistors printed on a PCB substrate 605, such as Alumina or Aluminum nitride, or FR-4, for example. As shown, the input equalizer 510 includes differential signal traces 610.

In this example, the capacitor 535 is a surface mount capacitor attached on the substrate 605 parallel to the resistor 530 (not shown) printed on the substrate 605. In some embodiments, the input equalizer 510 may be manufactured as a separate chip that may be attached, such as by soldering, on a main PCB board. The separate chip may improve flexibility for the placement of the input equalizer 510. In some embodiments, the chip may be fabricated on a PCB made from standard, low-cost materials (e.g., FR-4). In some embodiments, the separate chip may be fabricated using non-standard PCB materials. To improve signal integrity, for example, the substrate 605 may be made from dielectric materials having a substantially lower loss tangent than standard PCB materials.

Figure 7C:
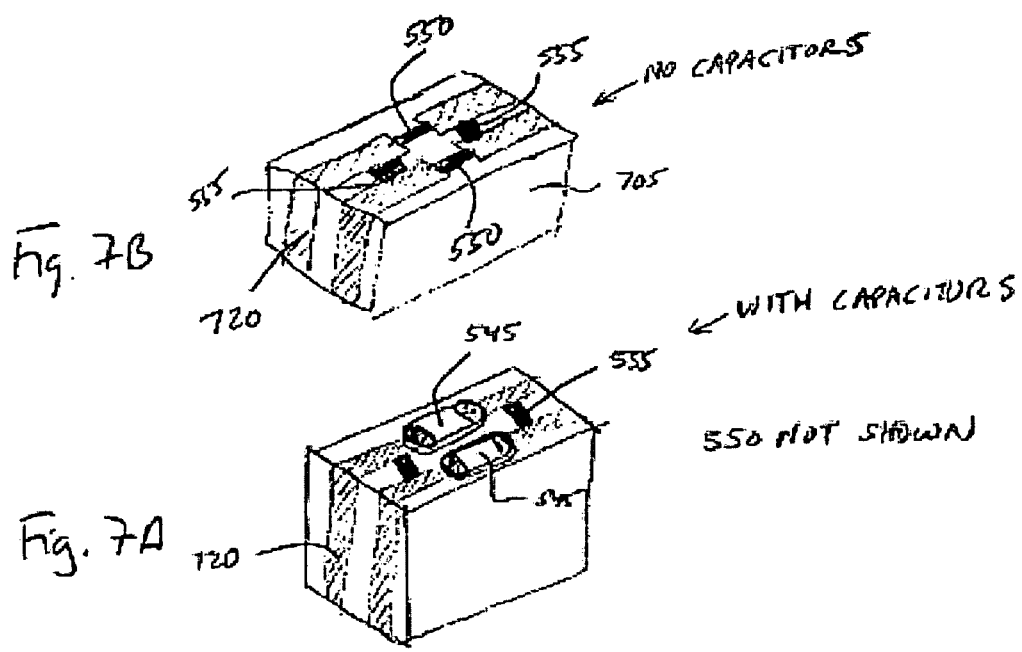
Figure 7C:
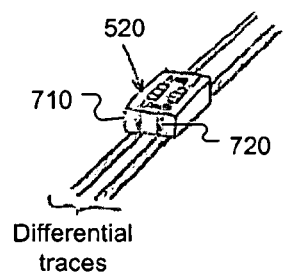

FIGS. 7A-E show an example of the output equalizer 520 that is implemented as a separate chip, or hybrid where the resistors 555 and 575 are printed on PCB (FIG. 7B) and surface-mount chip capacitors 545 are installed on top of resistors 545 as depicted in FIG. 7A. The chip or hybrid may be integrated in the signal path 115 to reduce high frequency signal loss in the output stage 525, for example in the repeater 127. As shown in FIG. 7A, the output equalizer 520 is implemented on a PCB substrate 705. In this example, the parallel resistors 555 are printed on the substrate 705 and the capacitors 545 are surface mounted capacitor chips attached in parallel with the series resistors 550 as shown in FIG. 7B. In some examples, the resistors 545, 555 may be thin or thick-film resistors (e.g., NiCr or TaN) integrated on the substrate 705.

In some embodiments, a manufacturer may print the resistors 550, 555 using NiCr or TaN on the substrates 705 while separately manufacture the capacitor chip 545. In some examples, the manufacture of the output equalizer 520 may be improved by manufacturing the capacitor chip 545 and the substrate 605 with printed resistors.

As shown in FIG. 7C, a chip 710 including the output equalizer 520 may be placed on top of a main PCB. In some embodiments, the chip 710 may interface with traces of the main PCB through a wrap-around metallization 720. For example, the chip 710 may contact the signal traces 225, 230 (FIG. 2) by having the wrap-around metallization connecting the differential signal traces on the PCB 705 and the signal traces 225, 230. In other embodiments, the chip 710 may interface with the differential traces of the main PCB using via connections.

Figure 7D:
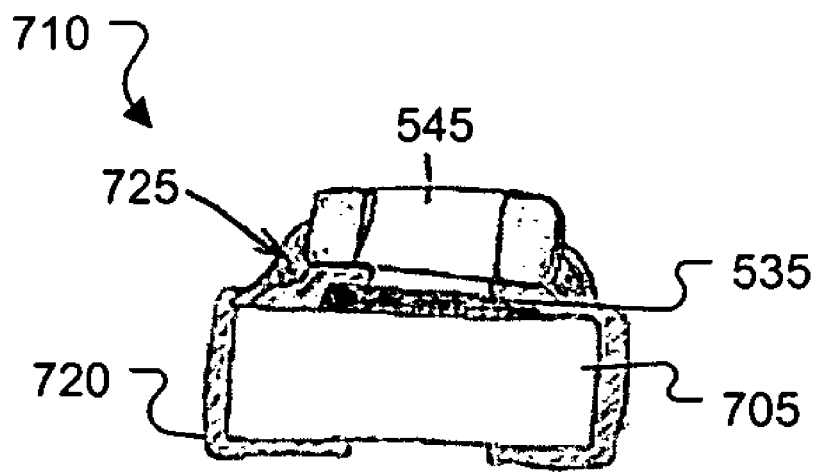
Figure 7E:
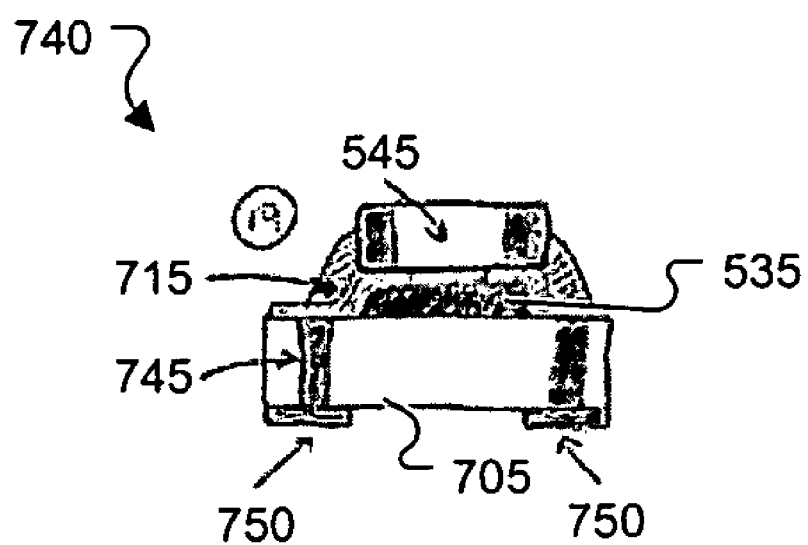

FIG. 7D shows an example of the chip 710 that includes the wrap-around metallization 720. As shown, the wrap-around metallization 720 connects the capacitor 545 and the series resistor 550 to the main PCB. Also, the capacitor 545 is connected to the wrap-around metallization 720 using an attachment 725, such as solder, epoxy, or polyepoxide.

In some embodiments, an exemplary chip 740 may also implement the output equalizer 520 using vias to interface the differential traces 720 and differential traces on the main PCB. The chip 740 includes vias 745 connected to the substrate 705. In some implementations, the chip 740 may have a relatively small size due to a smaller feature size for the series resistors 550 and parallel resistors 555 metallization of the chip 740.

In some embodiments, the techniques described with reference to FIGS. 7A-E may be used to manufacture the input equalizer 510 also. For example, the input equalizer 510 may also be manufactured as a separate chip attaching on a main PCB board using wrap-around metallization or vias.

Figure 8:
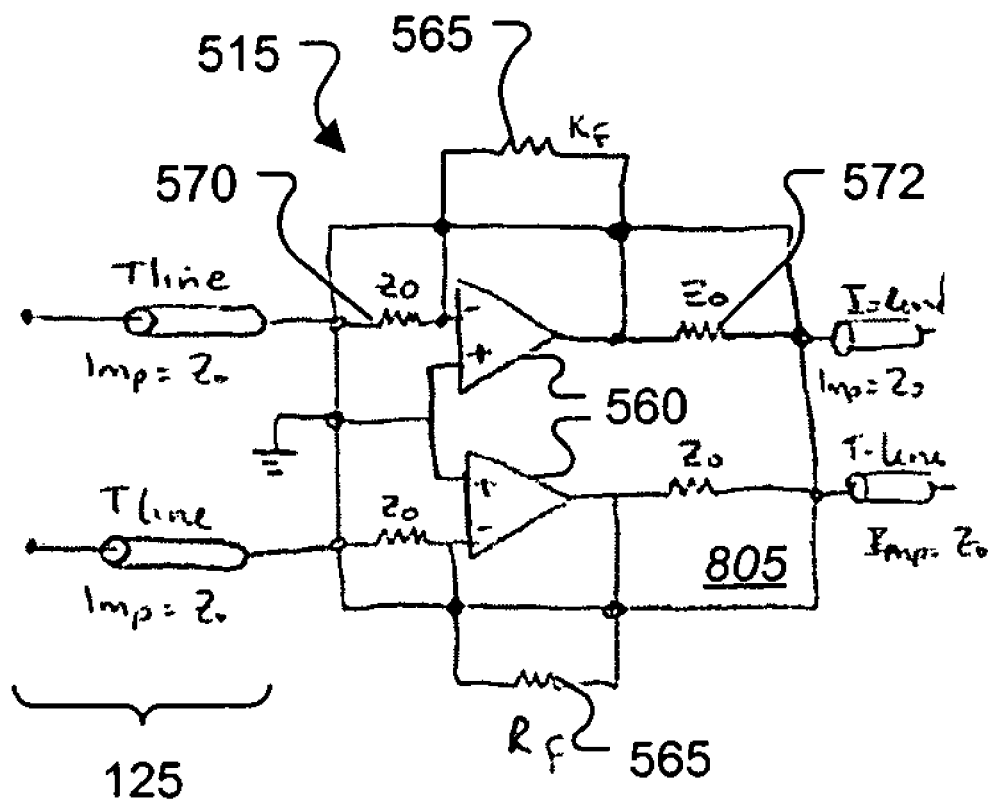
FIG. 8 shows a partial schematic representation for an example high speed op-amp with termination.

FIG. 8 shows an example of a dual high speed op-amp chip 805 for implementing the termination stage 515. In this example, the op-amp chip 805 includes the op-amps 560 and the termination resistors 570, 572. The op-amps 560 are integrated on-chip along with the termination resistors 570, 572. For example, the termination resistors may match a transmission line impedance, such as 50-100 Ohms, for example. The positive terminals of the op-amps 560 are connected to an external ground. In some embodiments, the negative input of the op-amps 560 may be seen as a virtual ground by incoming signals. In one example, signal losses are reduced when the signal termination is not connected to ground through a resistor directly.

In other examples, the input and/or output termination resistors 570, 572 may be implemented externally to allow more flexibility. For example, when impedances of the cables 125 are not standard, the external termination resistor may be adjustable to match characteristic impedance of the cables 125.

The feedback resistors 570 may be placed close to the input and output pins of the op-amps 560 to avoid stubs at the output and input circuit of the termination stage 515. Based on a required gain, the tap resistance, and the termination resistance, a feedback resistor 570 may be selected. For example, the gain of the termination stage 515 may be adjustable by varying the resistance of the feedback resistor 570. In some embodiments, the feedback resistors 570 may be integrated in the chip 805 or partially integrated in the chip 805. For example, the feedback resistors 565 may be a network of resistors. Some of the resistors are integrated in the chip 805 and some of the resistors are not. By varying the resistors outside of the chip 805, a user may control the gain. In some examples, the feedback resistor 570 may be integrated in the chip 805 so that the manufacturing cost of the termination stage 515 may be reduced.

Figure 9A:
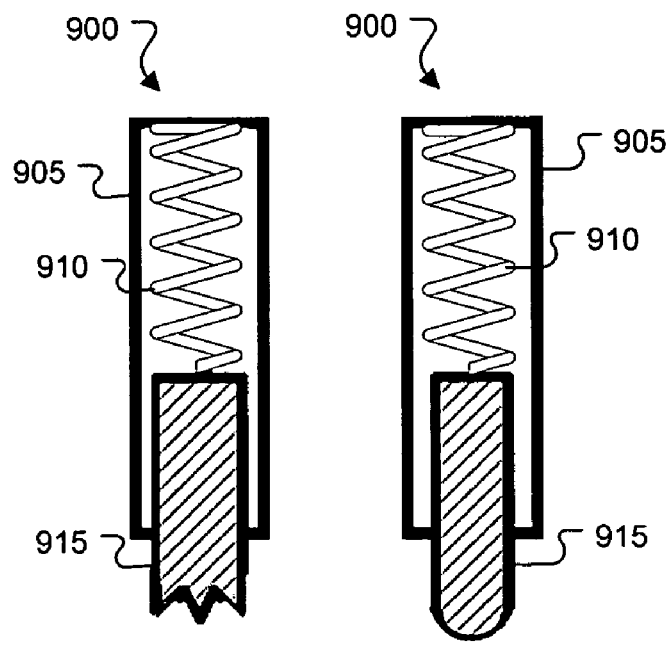
FIGS. 9A-9B show exemplary implementations of a connector pin.
Figure 9B:
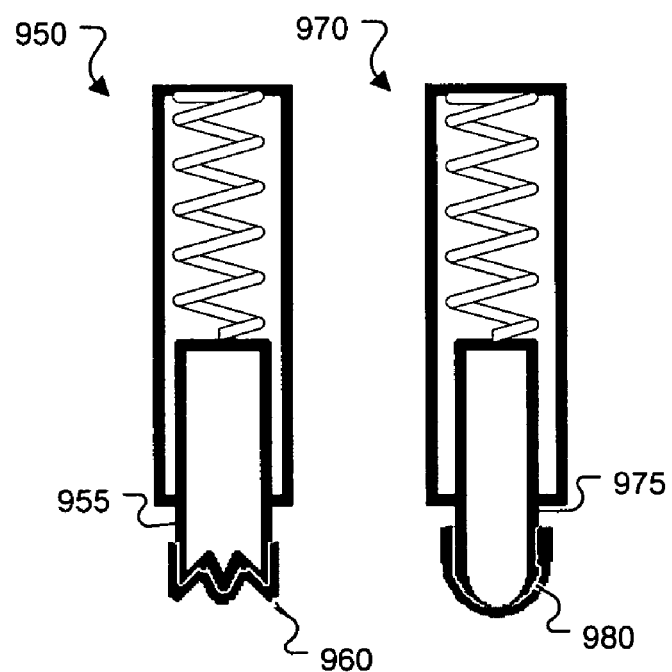

FIGS. 9A-9B show some examples of the connector pin 160. To reduce loading of the signal of the DUT 110, the connector pins 160 may include the tap resistors 530 on a surface on the tips of the connector pins 160. Additionally, the tap resistors 530 at the tips may reduce parasitic effects between the DUT 110 and thus reduce distortion of the signal of the DUT 110.

FIG. 9A shows exemplary spring pins 900 that are example embodiments of the connector pins 160. The pins 900 includes tap resistance at an area near the contact between the spring pin 900 and the DUT 110. In this example, the spring pin 900 includes a metal barrel 905, a spring 910, and an insulating plunger 915. By way of example, and not limitation, the insulating plunger 915 may be made of resistive material such as CarbonConX developed by Xerox Corporation in Connecticut.

The spring 910 is connected to the plunger 915. In other embodiments, other elastic structures or materials may be used instead of the spring 910. For example, a rubber band or a gas spring may be used instead of the coil spring depicted in FIG. 9A. The spring pin 900 may allow signals to propagate bidirectionally from and/or to the plunger 915 inside the barrel. For example, signals may propagate from the DUT 110 to the probe 120 via the plunger 915 and the spring 910. In some examples, the insulating plunger 900 may restrict current to flow in the plunger 900 and reduce loading and distortion of the signal of the DUT 110.

FIG. 9B shows addition spring pins 950, 970 that may reduce loading of the signal of the DUT when used as the connector pin 160. The spring pin 950 includes a plunger 955 with a crown-shaped tip 960, and the spring pin 970 includes a plunger 975 with a round resistive tip 980. By applying resistive conformal coating (e.g., from Acheson Colloid Company in Michigan) or by depositing resistive material (e.g., Carbon using a chemical vapor deposition process), the crown-shaped resistive tip 960 or the round resistive tip 980 can be coated on the pin 950 or the pin 970, respectively.

Although various embodiments that may be implemented in the system 100 of FIG. 1 have been described, other embodiments and features may be implemented in various systems and apparatus, or using other methods either alone or in combination. For example, solder mask may be selectively removed or a trench may be formed by processes that involve cutting, routing, abrading, and/or drilling for example. Such processes may be used alone, or in combination with, for example, chemical etching, plasma etching, or use of a laser.

Some embodiments may include other hardware and/or software. For example, a controller may be included in some embodiments to adjust a gain of an amplifier in the repeater box, select an optimal termination and or equalization parameter (e.g., parallel and/or series capacitance), or multiplexing signals. Some embodiments may include, for example, a controllable selection of channel(s) to amplify, gain factor(s) to apply to the selected signal(s), equalizer frequency response(s), and/or termination values to use (if any) for the amplified signals. Such control functions may be implemented, for example, using digital and/or analog circuits, which may include a processor programmed to perform such functions. Such a processor may communicate through a wired, wireless, or optical communication link to the analyzer 105, for example.

In some embodiments, the analyzer 105 may use the signal path 115 to transmit high speed signals to the DUT 110 also. For example, the analyzer 115 may transmit signal from the output stage 525 to the input stage 505, where the DUT 110 may receive the transmitted signals via the connection pins 160.

The repeater 127 may provide stored operational energy and power supplies (e.g., batteries), switching and/or linear power supply circuits, for example Operating power for the active circuits (e.g., operational amplifiers) may be provided through a cable, which may be incorporated in or separate from the cable 126, for example.

In various implementations, PCBs 135 and portions of their associated interfaces 130 may be partially or substantially enclosed in a protective housing. In the probe 120, for example, a housing may be provided for the connector pins 160, the PCB transmission line 135, and the interface 130. In some embodiments, the repeater box 127 may include a housing. Such a housing may be constructed from materials that may include, but are not limited to, plastic, insulation, and/or metal.

A number of implementations of the invention have been described. Nevertheless, it will be understood that various modifications may be made without departing from the spirit and scope of the invention. For example, advantageous results may be achieved if the steps of the disclosed techniques were performed in a different sequence, if components in the disclosed systems were combined in a different manner, or if the components were replaced or supplemented by other components. Accordingly, other implementations are within the scope of the following claims.

What is claimed is:

1. A waveform processing system comprising:
a transmission line;
a probe module to couple a high frequency signal under test to a distal end of the transmission line; and
a signal processing module having an input connected to a proximal end of the transmission line, wherein the signal processing module terminates the transmission line at a virtual reference node formed by an active feedback network so as to reduce attenuation of the signal.

2. The system of claim 1, wherein the transmission line comprises a length of flexible cable.

3. The system of claim 1, wherein the probe module further comprises an equalizer to compensate for at least part of an attenuation characteristic of the transmission line over a frequency range.

4. The system of claim 1, wherein at least one of the probe module and the signal processing module comprises:
a substantially planar substrate;
a first conductor and a second conductor formed on the substrate;
a dielectric layer comprising a dielectric material formed over the first and second conductors and having a first thickness; and
a region between the first and second conductors, wherein the dielectric layer has a second thickness that is substantially less than the first thickness.

5. The system of claim 4, wherein the dielectric layer comprises a solder mask.

6. The system of claim 4, wherein the region extends from the first conductor to the second conductor.

7. The system of claim 4, wherein one of the conductors comprises a plurality of vias that electrically connect to a reference conductor in another planar layer, wherein each via is separated from at least one of the other vias by no more than one quarter wavelength of the signal within a desired bandwidth.

8. The system of claim 1, wherein at least one of the probe module and the signal processing module comprises:
a substantially planar substrate layer formed of a dielectric material;
a first conductor and a second conductor formed on the substrate layer; and
a region between the first and second conductors, wherein the substrate layer has a reduced thickness in the region.

9. The system of claim 8, wherein one of the conductors comprises a plurality of vias that electrically connect to a reference conductor in another planar layer, wherein each via is separated from at least one of the other vias by no more than one quarter wavelength of the signal within a desired bandwidth.

10. The system of claim 1, wherein the signal processing module comprises an amplifier to form the virtual reference node.

11. The system of claim 1, wherein the signal processing module increases an amplitude of the signal by a gain greater than one.

12. The system of claim 1, wherein the virtual reference node comprises a virtual ground reference node.

13. The system of claim 1, wherein the waveform processing system includes an active probe assembly.

14. The system of claim 1, wherein the signal comprises a single-ended signal.

15. The system of claim 1, wherein the signal comprises a differential signal.

16. The system of claim 1, wherein the signal includes frequencies from about zero to at least about 150 GHz.

17. The system of claim 1, wherein the signal includes frequencies above at least 5 GHz.

18. The system of claim 1, wherein the signal includes frequencies from about 5 GHz to about 50 GHz.

19. The apparatus of claim 1, wherein the signal includes data rates above at least 5 Gbit/sec.

20. A waveform processing system comprising:
a transmission line;
a probe module to couple a high frequency signal under test to a distal end of the transmission line; and
means for actively terminating the signal without substantial attenuation.

21. The system of claim 20, wherein the terminating means further comprises means for amplifying the signal with a gain greater than unity.

22. The system of claim 20, wherein the probe module comprises means for reducing the loading of the signal under test.

23. A waveform processing system comprising:
a transmission line;
a probe module to couple a high frequency signal under test to a distal end of the transmission line; and
a signal processing module having an input connected to a proximal end of the transmission line, wherein the signal processing module terminates the transmission line at a virtual reference node so as to reduce attenuation of the signal;
wherein at least one of the probe module and the signal processing module comprises:
- a substantially planar substrate;
- a first conductor and a second conductor formed on the substrate, wherein one of the conductors comprises a plurality of vias that electrically connect to a reference conductor in another planar layer, wherein each via is separated from at least one of the other vias by no more than one quarter wavelength of the signal within a desired bandwidth;
- a dielectric layer comprising a dielectric material formed over the first and second conductors and having a first thickness; and
- a region between the first and second conductors, wherein the dielectric layer has a second thickness that is substantially less than the first thickness.

24. A waveform processing system comprising:
a transmission line;
a probe module to couple a high frequency signal under test to a distal end of the transmission line; and
a signal processing module having an input connected to a proximal end of the transmission line, wherein the signal processing module terminates the transmission line at a virtual reference node so as to reduce attenuation of the signal;
wherein at least one of the probe module and the signal processing module comprises:
- a substantially planar substrate layer formed of a dielectric material;
- a first conductor and a second conductor formed on the substrate layer, wherein one of the conductors comprises a plurality of vias that electrically connect to a reference conductor in another planar layer, wherein each via is separated from at least one of the other vias by no more than one quarter wavelength of the signal within a desired bandwidth; and
- a region between the first and second conductors, wherein the substrate layer has a reduced thickness in the region.

* * * * *